United States Patent
Yamamoto et al.

(10) Patent No.: US 6,687,107 B2
(45) Date of Patent: Feb. 3, 2004

(54) SEMICONDUCTOR INTEGRATED CIRCUIT DEVICE

(75) Inventors: Isao Yamamoto, Kyoto (JP); Koichi Miyanaga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/162,178

(22) Filed: Jun. 5, 2002

(65) Prior Publication Data

US 2002/0186067 A1 Dec. 12, 2002

(30) Foreign Application Priority Data

Jun. 8, 2001 (JP) ........................ 2001-173449

(51) Int. Cl.$^7$ .............................. H02H 5/04
(52) U.S. Cl. ...................... 361/103; 327/378
(58) Field of Search ............... 361/103, 93.8; 327/478, 512, 538, 539, 540, 378; 257/467, 470, 577

(56) References Cited

U.S. PATENT DOCUMENTS 5,195,827 A * 3/1993 Audy et al. ................. 374/172

* cited by examiner

Primary Examiner—Ronald W. Leja
(74) Attorney, Agent, or Firm—Sughrue Mion, PLLC

(57) ABSTRACT

Using the leakage current of the base resistance of the bipolar transistor, semiconductor integrated circuit device which detects an overheat condition of the elements protected from overheat, is realized. The overheat detection circuit and the elements or the circuits which might be protected from overheat, are formed on the same substrate.

The said overheat detection circuit is comprised of a bipolar transistor, its base resistance, and a constant-voltage source. The constant-voltage source provides a certain voltage to isolate the elements.

The joint base resistance is located close to elements or circuits which might be protected from overheat and located far from the constant-voltage source.

10 Claims, 3 Drawing Sheets

SEMICONDUCTOR INTEGRATED CIRCUIT DEVICE

FIELD OF THE INVENTION

The present invention relates to a semiconductor integrated circuit device such as semiconductor integrated circuit device, especially relates to a semiconductor integrated circuit device on which are mounted elements or circuits possibly to overheat and on which is mounted also an overheat detection circuit.

BACKGROUND OF THE INVENTION

As an overheat detection circuit mounted on the integrated circuit, those circuits shown in the drawing FIG. 4A through FIG. 4C have been known. In FIG. 4A, the circuit utilizes a thermal characteristic of diode's forward voltage drop, which detects the temperature of a place where the diode is located, and the said circuit produces an overheat detective signal when the temperature reaches a certain degree.

In FIG. 4B, an output is produced by the overheat detective signal in accordance with the increase of the leakage current of the base opened transistor, i.e. the increase of the backward current of the parasite diode between the base and the emitter indicated by dotted line.

Furthermore, in FIG. 4C, the overheat detection circuit senses the temperature by using the thermal characteristic of the constant-current source 1 and bipolar transistor 3 through the base resistance 2, and at the same time amplifies the detection current.

For that reason, this circuit is designed to flow the output current of the constant-current source 1 from the joint of the base 3 of the transistor 3 and the base resistance 2 to the base resistance 2.

And the collector current of the bipolar transistor 3 is transformed into the voltage signal by the pull-up resistance 4 and this voltage signal goes through the buffer 5. Thus the overheat detection current might be produced. The base resistor 2 is usually formed by a semiconductor pattern and so forth, surrounded by the well region 2a which is clamped to the base 3a of the transistor 3 in order to be isolated from the other circuit elements.

However, the above-said known overheat detection circuits used for the semiconductor device has advantages and disadvantages at the same time. For example, both the circuit shown in FIG. 4A and the circuit shown in FIG. 4C have an advantage and a disadvantage. It is easy to define the temperature freely to produce the detective signal, but it is difficult to match the transition into the overheat condition to what temperature of the detection.

As to the circuit in FIG. 4B, an advantage, on one hand, to detect correctly the transition into the overheat conditions since the leakage current changes rapidly in accordance with the overheat conditions. On the other hand, it is difficult to design a circuit to obtain the stable operation.

As the circuit in FIG. 4C has a base resistance, it is practical to use the circuit and it has an advantage to utilize the current amplification of the transistor without further additional elements.

In considering the above-said problem, such an overheat detection circuit is requested as can detect correctly the transition into the overheat condition and is easy to utilize. In replying to the request, one idea is to make react to the leakage current as in FIG. 4B, maintaining the advantage of the overheat detection circuit as in FIG. 4C. Therefore, it is the technical problem to improve the detection circuit based on the circuit in FIG. 4C.

SUMMARY OF THE INVENTION

It is an object of the invention to realize the semiconductor integrated circuit device which detects the overheat by way of the leakage current of the base resistance of the transistor The above mentioned object of the present is accomplished by using the leakage current of the base resistance of the bipolar transistor. It is an object of our invention to realize a semiconductor integrated circuit device which detects an overheat condition of the elements protected from an overheat is realized. That is, the overheat detection circuit is formed on the same substrate where the elements or the circuits which are protected from overheat are formed. The said overheat detection circuit comprises a bipolar transistor, its base resistance, and a constant-voltage source. The said constant-voltage source provides a certain voltage necessary to isolate the elements. In comparison with the prior art, overheat detection circuit in FIG. 4C, a constant-voltage source is introduced, and the base resistance is clamped to the output of the constant-voltage source.

In this semiconductor integrated circuit device, the leakage current from the well region to the base resistance is detected. The leakage current is stabilized by the constant-voltage source and is amplified by the transistor. And the operation of the bipolar transistor is stabilized because of the base resistance.

According to this invention, a semiconductor integrated circuit device, which detects an overheat based on the leakage current of the base resistance of the transistor, will be realized.

Another improvement is that in the above-mentioned device, the base resistance is located close to an elements and circuits protected from the overheat and located far from the constant-voltage source.

In this way the temperature of an object protected from overheat can be detected correctly based on the leakage current of the base resistance.

As the constant-voltage source which provide a certain voltage with the well region is located far from the protected objects, the constant-voltage source is not influenced by the thermal change caused by the overheat protected elements or circuits.

A certain voltage which contributes to a stabilization of the leakage current, is not influenced by the undesired thermal change. Therefore an overheat detection can be made correctly.

According to this second invention, a semiconductor integrated circuit device which can detect the overheat correctly based on the leakage current of the base resistance of the transistor.

PREFERRED EMBODIMENT OF THE INVENTION

Figure 1A:
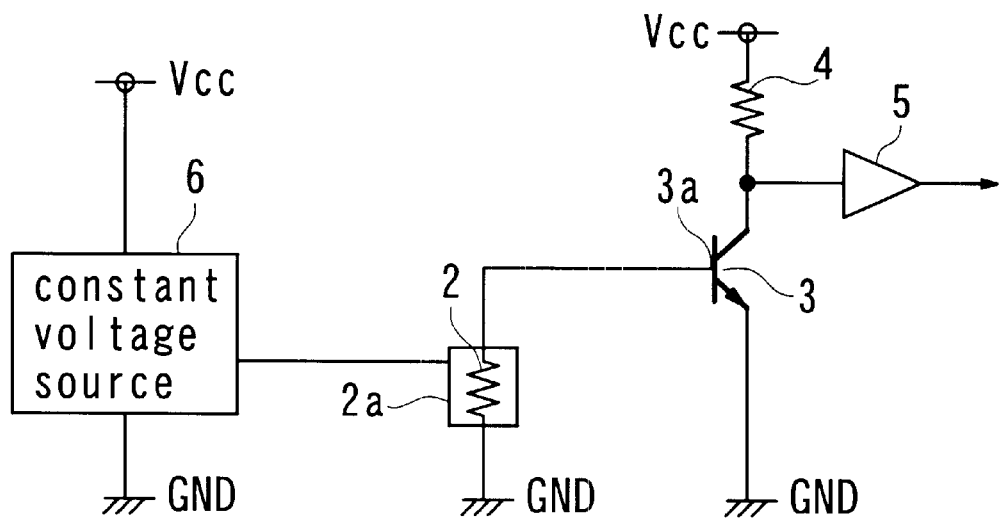
FIG. 1 is one of the embodiment of this invention, FIG. 1A being a circuit of the overheat detection circuit, and FIG. 1B being a front view in longitudinal section, showing the overheat detection circuit of this invention.
Figure 1B:
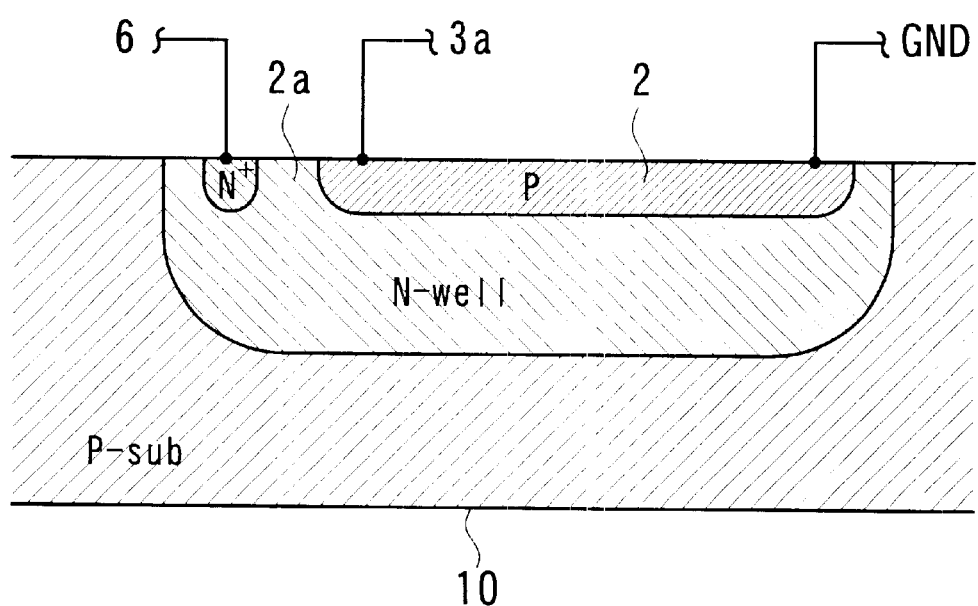
Figure 2:
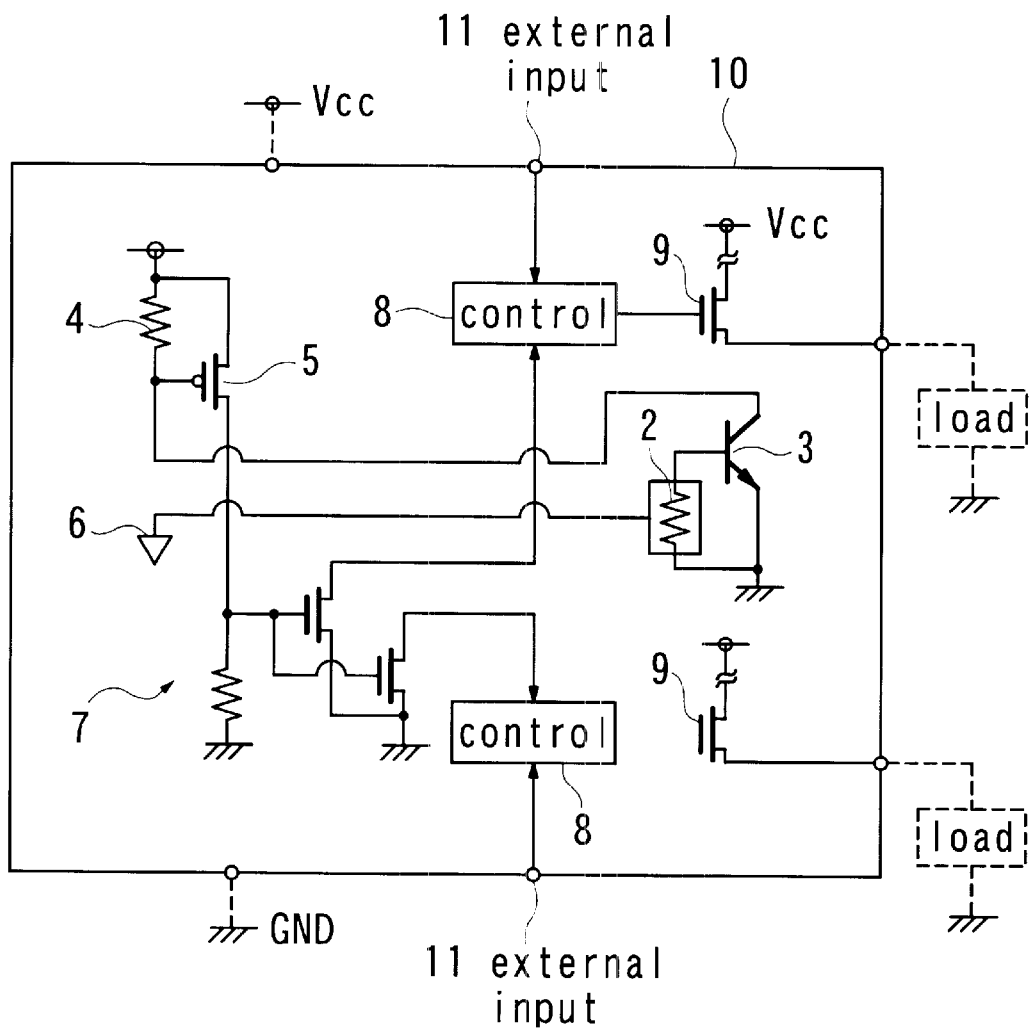
FIG. 2 is a circuit of the whole device of this invention.

Now, an embodiment of the present invention will described with reference to drawings. FIG. 1 shows the fundamental structure, FIG. 1A being the overheat detection circuit, FIG. 1B being the longitudinal cross section of the region where the base resistance is formed. FIG. 2 is the whole circuit of the device. The same number is used for the elements identical or relevant to those in the said prior art circuits.

This semiconductor integrated circuit device (in FIG. 2) has an one-chip-substrate 10. On this substrate an overheat detection circuit (2-6), an output-transistor 9 which is protected from the overheat condition and a control circuit 8 which controls output transistor 9 in accordance with the result of the overheat detection.

As two sets of the output transistor 9 and control circuits are mounted on the substrate, a detective signal distribution circuit 7 is provided in order to transmit overheat detective signal to both of the control circuits 8.

The overheat detection circuit (2-6) (in FIG. 1A) is provided with the NPN transistor 3. The base resistance 2 is connected to the base of the transistor as an overheat detection element which uses leakage current. In order to use it in the grounded-emitter connection mode which is practical to use, the transistor 3 is designed so that the base 3a of which is connected through the base resistance 2 to the ground GND, the emitter of which is connected to the ground GND, the collector of which is connected through pull-up resistor 4 to the power supply line Vcc. In addition, in order to produce the detective signal, the heat detection circuit (2-6) consists of the said pull-up resistance 4 which transforms the collector current into the voltage and of the buffer 5 having MOS transistor which may switch in accordance with the voltage.

In order to form the base resistance 2 in the overheat detection circuit (FIG. 1B), in case the substrate 10 is p-type, firstly n-type well region 2a should be formed and then p-type spot having an appropriate density is formed in an appropriate width and length within the said region 2a, so that the desired resistance and thermal characteristic are obtained.

The well region 2a is connected to the constant-voltage source 6, in order to isolate the base resistance 2 from other elements and circuits and in order to supply the leakage current in a stable condition. Thus a certain voltage, which is higher than the base may reach, is supplied to the well region 2a. The joint between the constant-voltage source 6 and the well region 2a, is made closer to the node of the base 3a and base 2 than the node of ground GND and base resistance 2 so that most of the leakage current runs toward transistor 3. In addition, high precision band-gap-voltage source and so forth is suitable for the constant-voltage source 6, and other type voltage source may also be used.

The output transistor 9 and the control circuit 8 (FIG. 2) constitute a power source which supplies power of a certain voltage to an external load. In that case the output transistor 9 is, for example, comprised of power elements such as MOS transistor. And the control circuit 8 controls on-off switching operation of the transistor 9 or its analog operation in accordance with the external input indicated and the feedback signal not indicated.

Also this circuit 8 stops the transistor 9's operation on receiving the overheat detective signal through the detective signal distribution circuit 7 from the buffer 5.

The said distribution circuit 7 may be comprised of MOS transistors or of bipolar type elements and some other elements insofar as it transmits the buffer's output to the control circuit 8, matching the output of the buffer 5 to the input of the control circuit 8.

Referring to the layout of the semiconductor integrated circuit device, the base resistor 2 and the bipolar transistor 3 may be located close to each other, preferably in the middle of them. And the constant-voltage supply source 6, the pull-up resistance 4 and the buffer 5 may be located as far as possible from the output transistor 9 in order to avoid the influence of the heat produced by the transistor 9.

Figure 3:
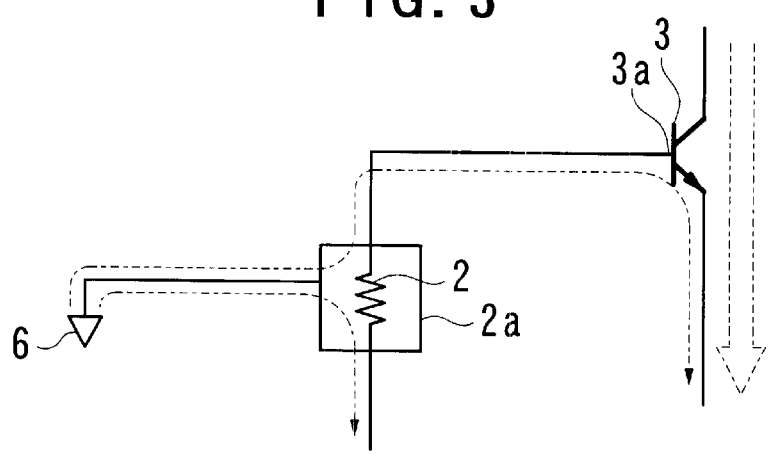
FIG. 3 is a drawing which describes the detection operation.
Figure 4A:
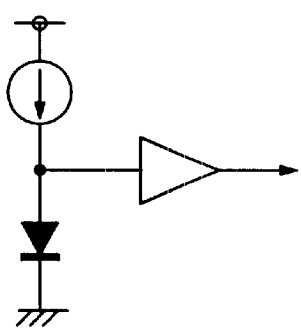
FIG. 4A through FIG. 4C are drawings showing a prior art overheat detection circuit.
Figure 4B:
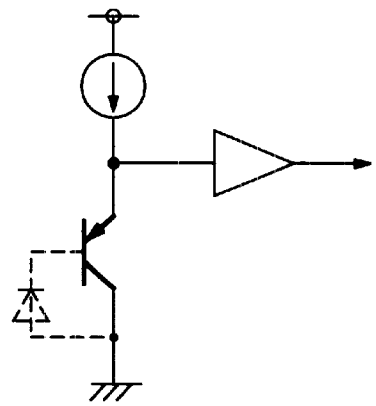
Figure 4C:
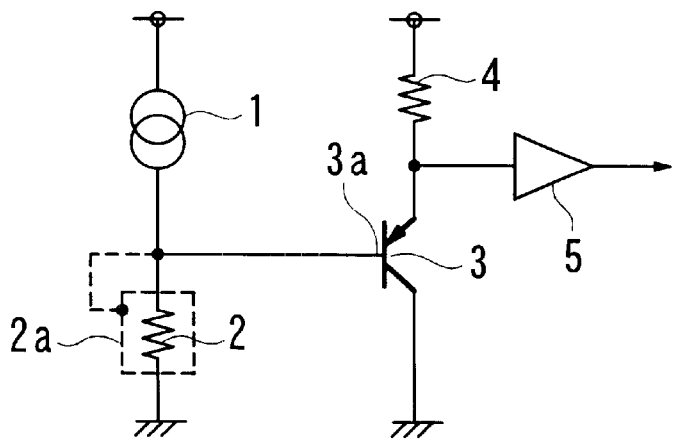

The mode and operation of the above said semiconductor integrated circuit device will be described referring to the figures. FIG. 3 describes the detection operation, especially describes the leakage current in the overheat detection operation and the collector current which amplifies the said leakage current.

In the normal operation mode, the current running in the base resistance 2 which are made up of forward current and leakage current, are very small, so that the transistor 3 is off. As a result the detective signal that is transmitted to the control circuit 8 through the buffer 5 and the detective signal distribution circuit 7, is not significant, i.e. the detective signal does not affect the operation, or the said detective signal is not transmitted.

The external input signal controls the operation of the circuit 8. Therefore the control circuit 8 controls the output transistor 9 in accordance with the external input signal, so that the transistor 9 keeps the switching operation.

The temperature of the transistor 9 rises as the transistor 9 operates, and so does the temperature of the base resistance region 2.

And so does increase the leakage current running through well region 2a and base resistance 2 from the constant-voltage source 6 to the ground GRD and to the base 3a of the transistor 3(2 dotted line in FIG. 3)

The leakage current which is run to the base 3a is amplified by the factor hfe(current amplification), and transformed into the collector current.

As the leakage current of the base resistance 2 made from semiconductor increases rapidly when the temperature of the semiconductor device approaches to the limit of operation, the temperature of the transistor 9 approaches to the upper limit, a significant detective signal is transmitted through the pull-up resistance 4 and the buffer 5.

And the control circuit 8 forces the transistor 9 to stop the operation.

Thus when the output transistor 9 becomes overheated, the detection circuit(2-6) detects it and stops the operation of the transistor 9.

The stop continues until the temperature of the transistor 9 goes down. When the temperature goes down to the certain degree, the transmission of the significant detective signal from the overheat detection circuit(2-6) stops and the operation of the transistor reopens.

In addition to the accurate detection of the overheat condition, in the normal operation mode when the circuit does not detect the overheat condition, the transistor 3 operates in a stable way since the base 3a of the transistor 3 is grounded through the base resistance 2. So the malfunction caused by instantaneous change of power supply line Vcc and electromagnetic noises coming from the exterior may be avoided. As a result, undesirable cases do not occur where the normal operation is stopped by the transmission of the unfavorable detective signal In the above said cases, the circuit has 2 output transistors 9 which are protected from an overheat. It may have one or more than three transistors.

And plural overheat detection circuits (2-6) may be used.

Moreover, transistor 3 may be PNP, not limited to the NPN transistor. Also, substrate 10 may be n-type, not limited to be p-type.

As for the p-type substrate 10, firstly p-type well region 2a should be formed and within that region 2a n-type base resistance 2 of appropriate density should be formed. The buffer 5 and the output transistor 9 may be bipolar transistor or may be some other sort of the elements, not limited by the MOS transistor. And the circuit may consist of a plural elements, not limited by a sole element.

It is clear from the above description that in the first embodiment, by changing the clamp point of the well region of the base resistance to the constant-voltage source, semiconductor integrated circuit device is realized, that can detect overheat based on the leakage current of the base resistance of the transistor.

Moreover, in the second embodiment, by allocating the overheat detection circuit in the semiconductor integrated circuit device, the overheat detection circuit semiconductor integrated circuit device is realized, that can detect more accurately overheat, based on the leakage current of the base resistance of the transistor.

What is claimed is:

1. A semiconductor integrated circuit device comprising:

a substrate an overheat detection circuit formed on said substrate, and elements or circuits that are formed on the same substrate as said overheat protection circuit and comprise overheat protected elements or circuits, said overheat detection circuit having an n-type or p-type well region formed in said substrate and a p-type or n-type semiconductor as a resistance layer formed in the n-type or p-type well region, said n-type or p-type well region being operative to isolate said p-type or n-type semiconductor from other elements or circuits formed on said substrate and serving as an input terminal for detection of leakage current to said resistance layer, said n-type or p-type well region being reversely biased by a stable constant-voltage source.

2. A semiconductor integrated circuit device as defined in claim 1, where said resistance layer is located close to said overheat protected elements or circuits, and at the same time the constant voltage source is located far from said overheat protected elements or circuits.

3. The semiconductor integrated circuit device as defined in claim 1, wherein said overheat detection circuit further comprises a pull up resistance coupled to a bipolar transistor and a buffer coupled to said resistance layer and said bipolar transistor.

4. The semiconductor integrated circuit device as defined in claim 1, wherein the clamp point of the well region of said resistance layer to the constant-voltage source is made closer to the node of a base of a bipolar transistor and the resistance layer than the node of ground and the resistance layer.

5. The semiconductor integrated circuit device as defined in claim 1, wherein said substrate comprises a plurality of elements or circuits that are protected by said overheat detection circuit.

6. The semiconductor integrated circuit device as defined in claim 1, further comprising a control circuit formed on said substrate for each said overheat protected elements or circuits.

7. The semiconductor integrated circuit device as defined in claim 3, wherein said bipolar transistor is an NPN transistor.

8. The semiconductor integrated circuit device as defined in claim 3, wherein said bipolar transistor is a PNP transistor.

9. The semiconductor integrated circuit device as defined in claim 1, further comprising a plurality of said overheat detection circuits and corresponding overheat protected elements or circuits.

10. The semiconductor integrated circuit device as defined in claim 4, wherein a leakage current which is run to the base of said transistor is amplified and transformed into a collector current.

* * * * *